US012635367B2

(12) United States Patent
Xu et al.

(10) Patent No.: US 12,635,367 B2
(45) Date of Patent: May 19, 2026

(54) DISPLAY PANELS AND DISPLAY DEVICES WITH COIL ELECTRICALLY CONNECTED TO ELECTRODE OF LIGHT EMITTING UNIT

(71) Applicant: BOE Technology Group Co., Ltd., Beijing (CN)

(72) Inventors: Rui Xu, Beijing (CN); Penghao Gu, Beijing (CN); Guanqin Chen, Beijing (CN); Bo Wang, Beijing (CN); Hui Zhao, Beijing (CN); Wenxiu Zhu, Beijing (CN); Hualing Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 399 days.

(21) Appl. No.: 18/025,738

(22) PCT Filed: Mar. 7, 2022

(86) PCT No.: PCT/CN2022/079493
§ 371 (c)(1),
(2) Date: Mar. 10, 2023

(87) PCT Pub. No.: WO2023/168549
PCT Pub. Date: Sep. 14, 2023

(65) Prior Publication Data
US 2024/0292686 A1 Aug. 29, 2024

(51) Int. Cl.
*H10K 59/131* (2023.01)
*H10K 59/122* (2023.01)
*H10K 59/123* (2023.01)

(52) U.S. Cl.
CPC ......... *H10K 59/131* (2023.02); *H10K 59/122* (2023.02); *H10K 59/123* (2023.02)

(58) Field of Classification Search
CPC ... H10K 59/131; H10K 59/122; H10K 59/123
See application file for complete search history.

(56) References Cited

U.S. PATENT DOCUMENTS 6,606,247 B2 * 8/2003 Credelle ................. H01L 24/82
257/E29.022
2002/0181208 A1 * 12/2002 Credelle ............... H05K 1/141
257/E29.022
(Continued)

FOREIGN PATENT DOCUMENTS

CN 1881760 A 12/2006
CN 206250195 U 6/2017
(Continued)

OTHER PUBLICATIONS

English translation of CN 113658534 A (Year: 2021).*
PCT/CN2022/079493 international search report.
CN2022800003996 first office action date Mar. 4, 2026.

*Primary Examiner* — Lex H Malsawma
(74) *Attorney, Agent, or Firm* — IPro, PLLC

(57) ABSTRACT

The display panel includes a substrate; a light emitting unit disposed on the substrate and including a first electrode, a second electrode and a light emitting layer, wherein the first electrode is disposed opposite to the second electrode, and the light emitting layer is located between the first electrode and the second electrode; a coil disposed on the substrate, the coil being capable of generating current for operation of the light emitting unit, the coil being electrically connected to the first electrode and/or the second electrode; a voltage stabilizing circuit, a rectifying circuit and a driving circuit, wherein an input terminal of the voltage stabilizing circuit is electrically connected to the coil, an output terminal of the voltage stabilizing circuit is electrically connected to an input terminal of the rectifying circuit, an output terminal of the rectifying circuit is electrically connected to an input (Continued)

terminal of the driving circuit, and an output terminal of the driving circuit is electrically connected to the light emitting unit.

20 Claims, 6 Drawing Sheets

(56)                References Cited

U.S. PATENT DOCUMENTS

| | | | |
|---|---|---|---|
| 2006/0284864 A1 | 12/2006 | Woo | |
| 2019/0311674 A1* | 10/2019 | Shin | G09G 3/3266 |
| 2020/0074920 A1* | 3/2020 | Lee | G09G 3/3208 |
| 2022/0069027 A1 | 3/2022 | Wang et al. | |
| 2023/0208012 A1 | 6/2023 | Gu et al. | |

FOREIGN PATENT DOCUMENTS

| | | | | |
|---|---|---|---|---|
| CN | 111799320 A | | 10/2020 | |
| CN | 112101506 A | | 12/2020 | |
| CN | 112635528 A | | 4/2021 | |
| CN | 113178534 A | | 7/2021 | |
| CN | 113571546 A | | 10/2021 | |
| CN | 113658534 A | * 11/2021 | | G09G 3/3208 |
| DE | 102011122797 A1 | | 12/2012 | |
| JP | 2006018132 A | | 1/2006 | |
| JP | 2009072043 A | | 4/2009 | |
| KR | 20170015699 A | * 2/2017 | | H01L 27/326 |

* cited by examiner

DISPLAY PANELS AND DISPLAY DEVICES WITH COIL ELECTRICALLY CONNECTED TO ELECTRODE OF LIGHT EMITTING UNIT

CROSS-REFERENCE TO RELATED APPLICATIONS

The present disclosure is the U.S. national phase of PCT Application No. PCT/CN2022/079493 filed on Mar. 7, 2022.

TECHNICAL FIELD

Embodiments of the present disclosure relate to display panels and display devices.

BACKGROUND

With developments of economy, display panels have been widely used in people's lives. The display panel mainly includes a light emitting unit. The light emitting unit comprises two electrodes arranged oppositely and a light emitting layer located between the two electrodes. The two electrodes are electrically connected to a power supply to supply power to the light emitting layer. However, conventional display panels have a poor use effect.

SUMMARY

An object of the present disclosure is to provide display panels and display devices.

According to an aspect of the present disclosure, provided is a display panel, comprising:

a substrate;

a light emitting unit disposed on the substrate and comprising a first electrodes, a second electrode and a light emitting layer, wherein the first electrode is disposed opposite to the second electrode, and the light emitting layer is located between the first electrode and the second electrode;

a coil disposed on the substrate, the coil being capable of generating current for operation of the light emitting unit, the coil being electrically connected to the first electrode and/or the second electrode;

a voltage stabilizing circuit, a rectifying circuit and a driving circuit, wherein an input terminal of the voltage stabilizing circuit is electrically connected to the coil, an output terminal of the voltage stabilizing circuit is electrically connected to an input terminal of the rectifying circuit, an output terminal of the rectifying circuit is electrically connected to an input terminal of the driving circuit, and an output terminal of the driving circuit is electrically connected to the light emitting unit.

Further, the coil is electrically connected to the first electrode and the second electrode, and the display panel further comprises:

a first planarization layer covering the coil and provided with a first window and a second window exposing the coil;

wherein the light emitting unit is disposed on a side of the first planarization layer away from the substrate, the first electrode extends into the first window and is electrically connected to the coil, and the second electrode extends into the second window and is electrically connected to the coil.

Further, the display panel further comprises a switch element disposed on the substrate, wherein the coil is electrically connected to the first electrode, and the switch element is connected in series between the coil and the second electrode.

Further, the switch element comprises a transistor, a first pole of the transistor is electrically connected to the first electrode through the coil, and a second pole of the transistor is electrically connected to the second electrode.

Further, the display panel further comprises:

a second planarization layer disposed on a side of the transistor away from the substrate, the coil being disposed on a side of the second planarization layer away from the substrate and passing through the second planarization layer to be electrically connected to the first pole of the transistor;

a first planarization layer disposed on a side of the coil away from the substrate and provided with a first window exposing the coil;

wherein the light emitting unit is disposed on a side of the first planarization layer away from the substrate, and the first electrode extends into the first window and is electrically connected to the coil.

Further, the second electrode is located on a side of the first electrode away from the substrate or on a side of the second electrode away from the substrate.

Further, there are a plurality of the light emitting units, the plurality of light emitting units share the second electrode, and the display panel further comprises:

a pixel defining layer disposed on a side of the first planarization layer away from the substrate and provided with a plurality of openings, the plurality of light emitting units being disposed in the plurality of openings in a one-to-one correspondence, and the second electrode being located on a side of the first electrode away from the substrate;

wherein there are a plurality of the first windows, and the first electrodes of the plurality of light emitting units extend into the plurality of first windows in one-to-one correspondence so as to be electrically connected to the coil.

Further, the coil comprises a plurality of coil layers stacked in a thickness direction of the substrate, and two adjacent ones of the coil layers are connected in series.

Further, there are a plurality of the light emitting units, and the plurality of light emitting units form an anti-counterfeiting pattern.

Further, there are a plurality of the light emitting units, the plurality of light emitting units form a plurality of light emitting regions, each of the light emitting regions is in a strip-shaped structure, and at least two of the plurality of light emitting regions have different widths.

Further, there are a plurality of the light emitting units, the plurality of light emitting units comprises a first light emitting unit and a second light emitting unit, the first light emitting unit has a first orthographic projection on the substrate, the second light emitting unit has a second orthographic projection on the substrate, the first orthographic projection is defined with a first boundary and a second boundary opposite to each other and has a first center line located between the first boundary and the second boundary, the second orthographic projection is defined with a third boundary and a fourth boundary opposite to each other and has a second center line located between the third boundary and the fourth boundary, the first boundary, the second boundary, the first center line, the third boundary, the fourth boundary and the second center line extend in a same direction, the first boundary and the third boundary are located on a same side of the second center line, the second boundary and the fourth boundary are located on a same side of the second center line, and the first boundary is located between the second center line and the third boundary.

Further, the first center line is located between the second center line and the fourth boundary.

Further, the fourth boundary is located between the second boundary and the first center line.

Further, there are a plurality of the light emitting units, the plurality of light emitting units form one or more light emitting regions, each of the light emitting regions has a strip-shaped structure, and one or more protrusions are provided at an edge of the light emitting region in a width direction of the light emitting region.

Further, there are a plurality of the light emitting units, the plurality of light emitting units form one or more light emitting regions, and the light emitting region is capable of displaying an image having a color deviation.

Further, the coil and the light emitting unit are located on two sides of the substrate, the voltage stabilizing circuit, the rectifying circuit, the driving circuit and the coil are located on a same side of the substrate, and the driving circuit is electrically connected to the light emitting unit through a flexible circuit board.

Further, the display panel further comprises:

a base disposed on a side of the substrate away from the light emitting unit, wherein the voltage stabilizing circuit, the rectifying circuit, the driving circuit and the coil are disposed on a surface of the base away from the substrate: one end of the flexible circuit board is electrically connected to the driving circuit, and the other end of the flexible circuit board is electrically connected to the light emitting unit.

According to an aspect of the present disclosure, provided is a display device comprising the display panel.

Further, the display device further comprises:

a housing provided with an opened end, wherein the display panel is disposed in the housing, and a light emitting side of the display panel faces the opened end.

According to the display panel and the display device of the present disclosure, when an outside electronic equipment provided with an emitting coil is close to the display panel of the embodiment, the coil of the present disclosure can generate current for operation of the light emitting unit through electromagnetic induction, so that the display panel displays without a power supply, and use effects of the display panel can be improved.

Figure 1:
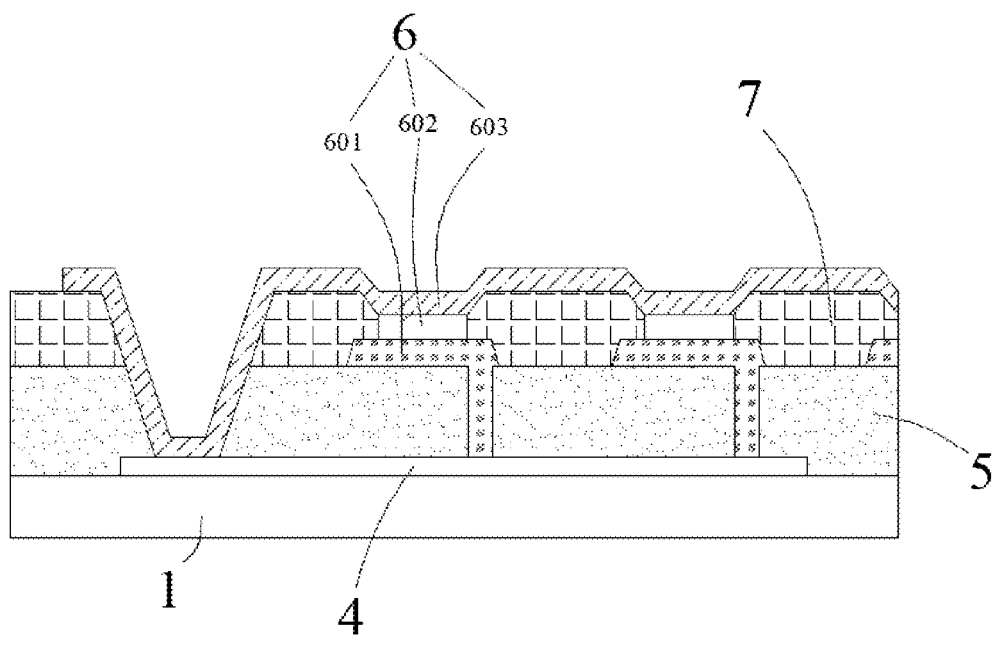
FIG. 1 is a schematic diagram of a display panel according to an embodiment of the present disclosure.

Reference signs: 1. substrate; 2. transistor; 201 active layer; 202, gate insulating layer; 203, gate layer; 204, interlayer insulating layer; 205, first pole; 206, second pole; 3. second planarization layer; 4. coil; 5. first planarization layer; 6. light emitting unit; 601. first electrode; 602. light emitting layer; 603. second electrode; 605. second light emitting unit; 606. third light emitting unit; 607. first light emitting unit; 7. pixel defining layer; 8. insulating material layer; 9. first adhesive layer; 10. base; 11. buffer pad; 12. second adhesive layer; 13. voltage stabilizing circuit; 14. rectifying circuit; 15. MUX circuit; 16. driving circuit; 17. flexible circuit board; 18. circuit wiring region; 19. sealant; 20. cover plate; 21. housing; 22. third adhesive layer; 23. light emitting region; 24. communication circuit; 25. integrated chip; 26. protrusion; 27. first boundary; 28. second boundary; 29. first center line; 30. third boundary; 31. fourth boundary; 32. second center line; 33. first orthographic projection; 34. second orthographic projection.

DETAILED DESCRIPTION OF THE EMBODIMENTS

Reference will now be made in detail to exemplary embodiments, examples of which are illustrated in the accompanying drawings. When the following description refers to the drawings, the same numbers in different drawings indicate the same or similar elements unless otherwise indicated. The embodiments described in the following exemplary embodiments do not represent all embodiments consistent with the present disclosure. Rather, they are merely examples of means consistent with some aspects of the present disclosure as detailed in the appended claims.

The terminology used in the present disclosure is for the purpose of describing particular embodiments only and is not intended to be limiting of the present disclosure. Unless otherwise defined, technical or scientific terms used in the present disclosure should have a common meaning as understood by those skilled in the art to which the present disclosure belongs. The terms "first", "second", and the like, as used in the specification and claims of the present disclosure do not denote any order, quantity, or importance, but rather are used to distinguish one component from another. Likewise, similar words such as "a" or "an" do not denote a limitation of quantity, but rather denote the presence of at least one. "Multiple" or "a plurality of" means two or more. Unless stated otherwise, the words such as "front." "rear." "lower." "upper" and/or the like are used for ease of description only and are not limited to one position or one spatial orientation. The terms "comprising", "including" or the like are intended to indicate that elements or objects preceding the "comprising" or "including" encompass elements or objects listed after the "comprising" or "including" and equivalents thereof, and do not exclude other elements or objects. The terms "connected", "connecting" or the like are not limited to physical or mechanical connections, and may include electrical connections, whether direct or indirect connections. As used in this specification and the appended claims, the singular forms "a," "an," and "the" are intended to include the plural forms as well, unless the context clearly indicates otherwise. It will also be understood that the term "and/or" as used herein refers to and encompasses any or all possible combinations of one or more of the associated listed items.

Figure 10:
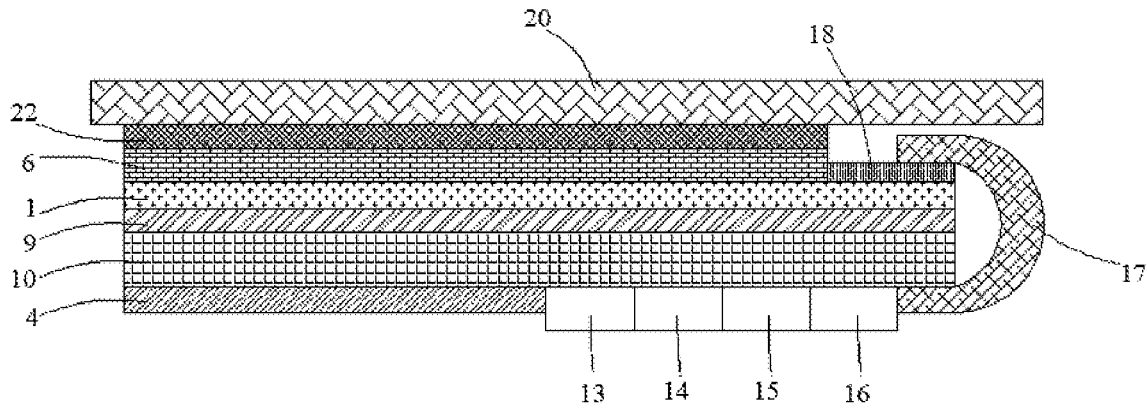
FIG. 10 is another schematic diagram of a display panel according to an embodiment of the present disclosure.

Embodiments of the present disclosure provide a display panel. As shown in FIGS. 1 and 10, the display panel may include a substrate, a light emitting unit 6, a coil 4, a voltage stabilizing circuit 13, a rectifying circuit 14, and a driving circuit 16.

The light emitting unit 6 is disposed on the substrate 1. The light emitting unit 6 may include a first electrode 601, a second electrode 603, and a light emitting layer 602 disposed between the first electrode 601 and the second electrode 603. The coil 4 is disposed on the substrate 1. The coil 4 can generate current for operation of the light emitting unit 6. The coil 4 is electrically connected to the first electrode 601 and/or the second electrode 603. The voltage stabilizing circuit 13 has an input terminal which is electrically connected to the coil 4 and has an output terminal which is electrically connected to an input terminal of the rectifying circuit 14. The rectifier circuit 14 has an output terminal which is electrically connected to an input terminal of the driving circuit 16. The driving circuit 16 has an output terminal which is electrically connected to the light emitting unit 6.

In the display panel according to the embodiments of the present disclosure, when an outside electronic device provided with a transmitting coil is close to the display panel according to the embodiments of the present disclosure, since the coil according to the embodiments of the present disclosure can generate current for the operation of the light emitting unit by means of electromagnetic induction, the display panel can display without a power supply, thereby improving use effects of the display panel. The outside electronic device may be a mobile phone, which may include NFC and the like.

Respective parts of the display panel according to the embodiments of the present disclosure will be described in detail below:

As shown in FIG. 1, the substrate 1 may be a rigid substrate. The rigid substrate may be a glass substrate, a polymethyl methacrylate (PMMA) substrate, or the like. Of course, the substrate 1 may also be a flexible substrate. The flexible substrate may be a polyethylene terephthalate (PET) substrate, a polyethylene naphthalate (PEN) substrate, or a polyimide (PI) substrate.

Figure 7:
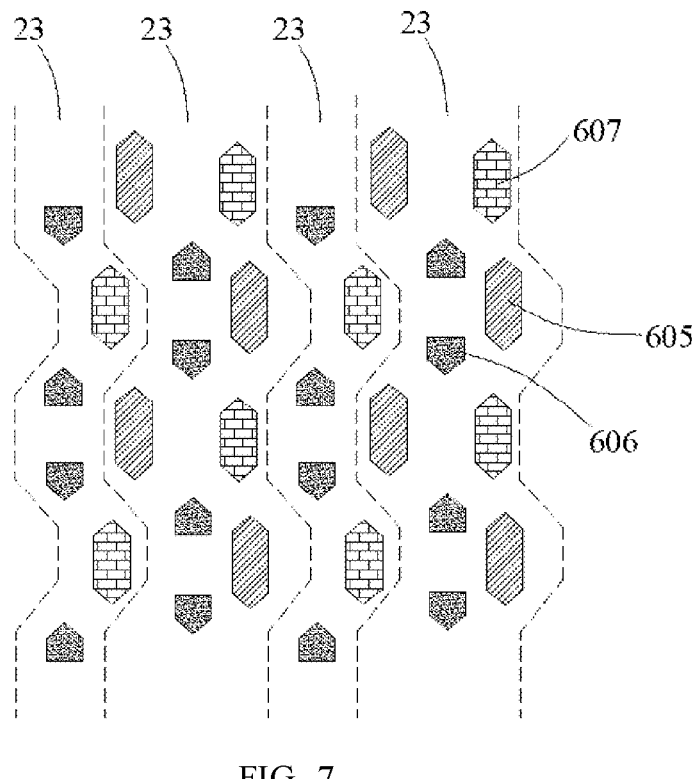
FIG. 7 is a schematic diagram of a light emitting region according to an embodiment of the present disclosure.
Figure 9:
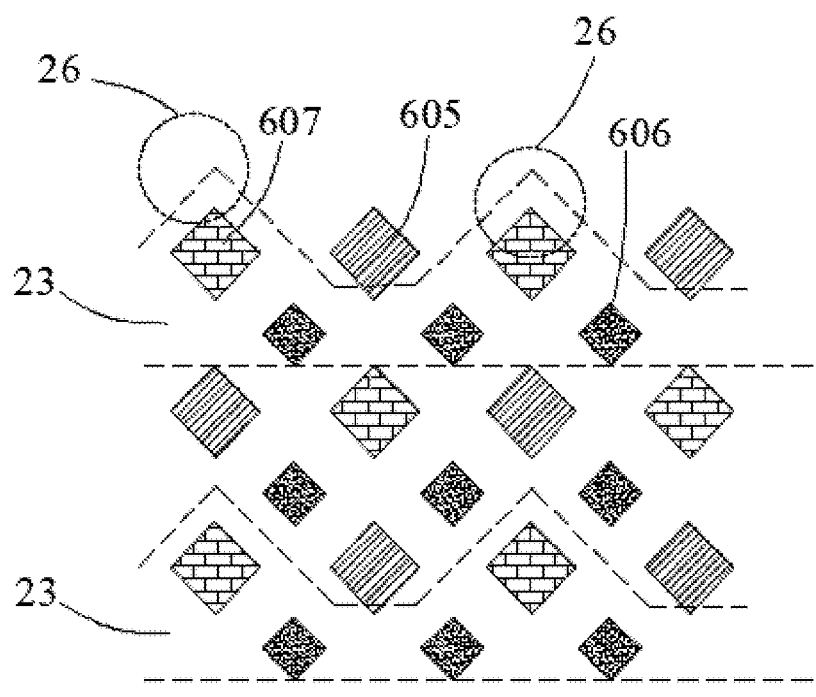
FIG. 9 is another schematic diagram of a light emitting region according to an embodiment of the present disclosure.

One of the first electrode 601 and the second electrode 603 is an anode, and the other is a cathode. For example, the first electrode 601 is an anode, and the second electrode 603 is a cathode. The light emitting layer 602 may be an organic electroluminescent layer, a quantum dot light emitting layer, a liquid crystal light emitting layer, or the like. For example, the light emitting layer 602 is an organic electroluminescent layer. There may be a plurality of the light emitting units, the plurality of light emitting units may share the second electrode 603, and each of the light emitting units 6 has a first electrode 601 of itself. The light emitted by different light emitting units 6 may be of the same color, but of course may be of different colors. For example, as shown in FIGS. 7 and 9, the plurality of light emitting units 6 may include a second light emitting unit 605, a third light emitting unit 606 and a first light emitting unit 607. The second light emitting unit 605 may emit blue light, the third light emitting unit 606 may emit green light, and the first light emitting unit 607 may emit red light, which is not limited particularly in the present disclosure. In addition, the plurality of light emitting units 6 may form an anti-counterfeiting pattern.

Figure 2:
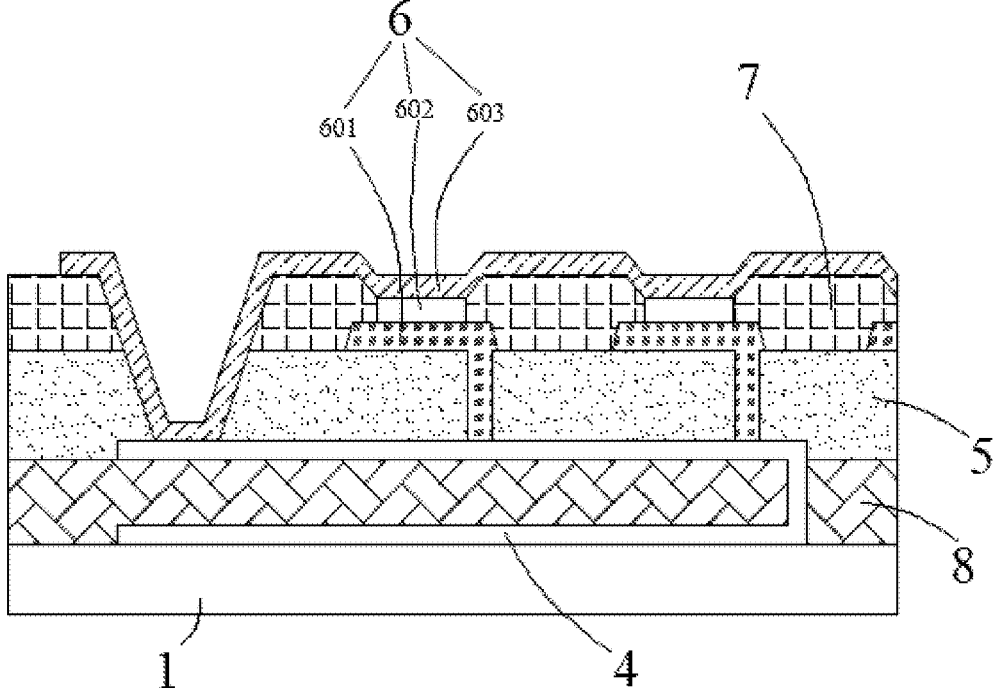
FIG. 2 is another schematic diagram of a display panel according to an embodiment of the present disclosure.
Figure 5:
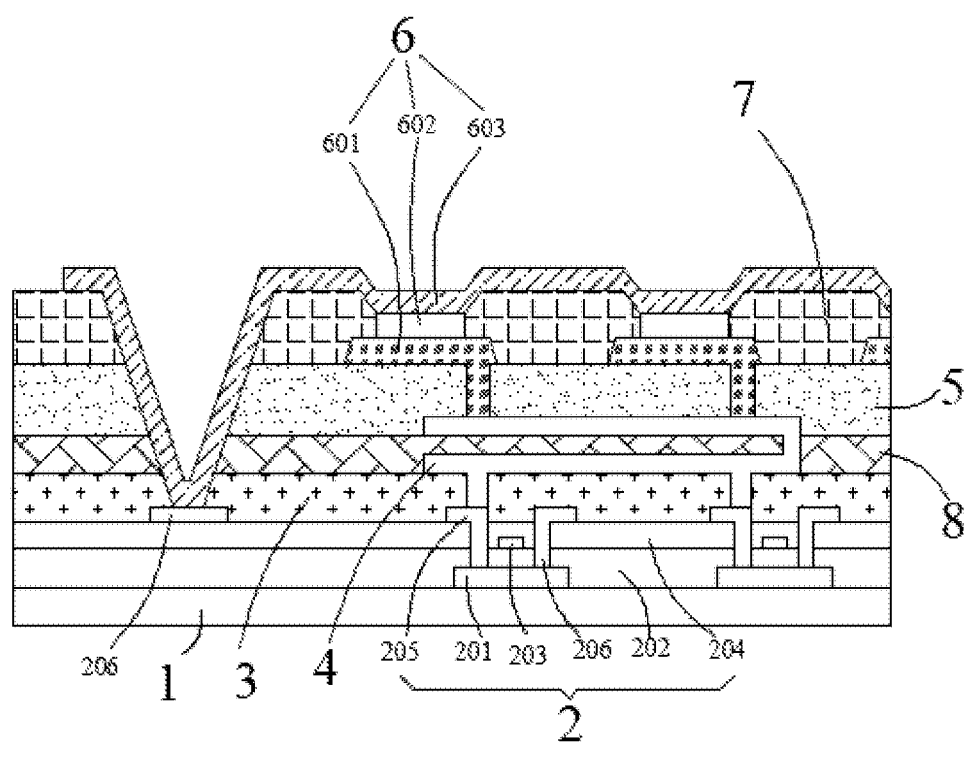
FIG. 5 is another schematic diagram of a display panel including a transistor according to an embodiment of the present disclosure.

As shown in FIG. 1, the coil 4 is disposed on the substrate 1 and can generate current by means of electromagnetic induction for the operation of the light emitting unit 6. As shown in FIGS. 2 and 5, the coil 4 may include a plurality of coil layers stacked in a thickness direction of the substrate 1, an insulating material layer 8 may be disposed between two adjacent coil layers, and one coil layer may pass through the insulating material layer to be connected in series with another coil layer. For example, the coil 4 may include two coil layers.

Figure 3:
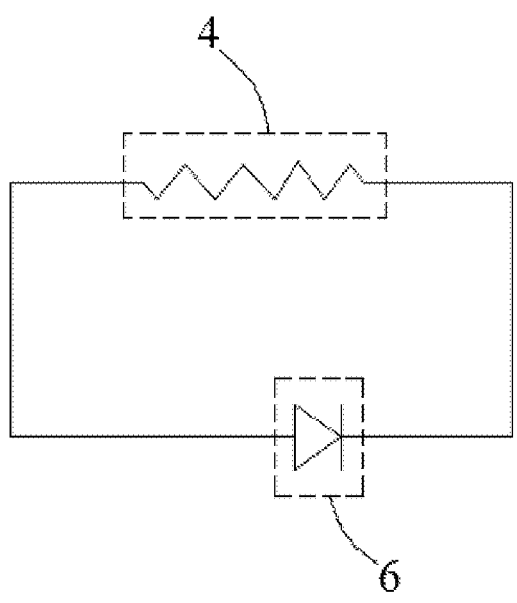
FIG. 3 is a circuit diagram of a coil and a light emitting unit according to an embodiment of the present disclosure.

As shown in FIGS. 1 to 3, the coil 4 is electrically connected to the first electrode 601 and the second electrode 603. Specifically, the display panel as described above may further include a first planarization layer 5. The first planarization layer 5 may cover the coil 4. That is, the coil 4 is located between the first planarization layer 5 and the substrate 1. The first planarization layer 5 may also be provided with a first window and a second window exposing the coil 4. The first window is spaced apart from the second window: The above light emitting unit 6 may be disposed on a side of the first planarization layer 5 away from the substrate 1. The first electrode 601 extends into the first window and is electrically connected to the coil 4, and the second electrode 603 extends into the second window and is electrically connected to the coil 4. The display panel of the embodiments of the present disclosure may further include a pixel defining layer 7. The pixel defining layer 7 may be disposed on a side of the first planarization layer 5 away from the substrate 1 and provided with a plurality of openings. The plurality of light emitting units 6 are provided in the plurality of openings in one-to-one correspondence. For each of the light emitting units 6, the second electrode 603 is located on a side of the first electrode 601 away from the substrate 1. In the above embodiments, there may be a plurality of the first windows, the first electrodes 601 of the plurality of light emitting units 6 extend into the plurality of first windows in one-to-one correspondence so as to be electrically connected to the coil 4. For the display panel of the present embodiment, when the outside electronic device provided with the emitting coil is close to the display panel of the present embodiment, the coil 4 in the display panel of the present embodiment generates current by means of electromagnetic induction, so as to supply power to the first pole 205 and the second pole 206 of the light emitting units 6, so that the plurality of light emitting units display an anti-counterfeiting pattern.

Figure 4:
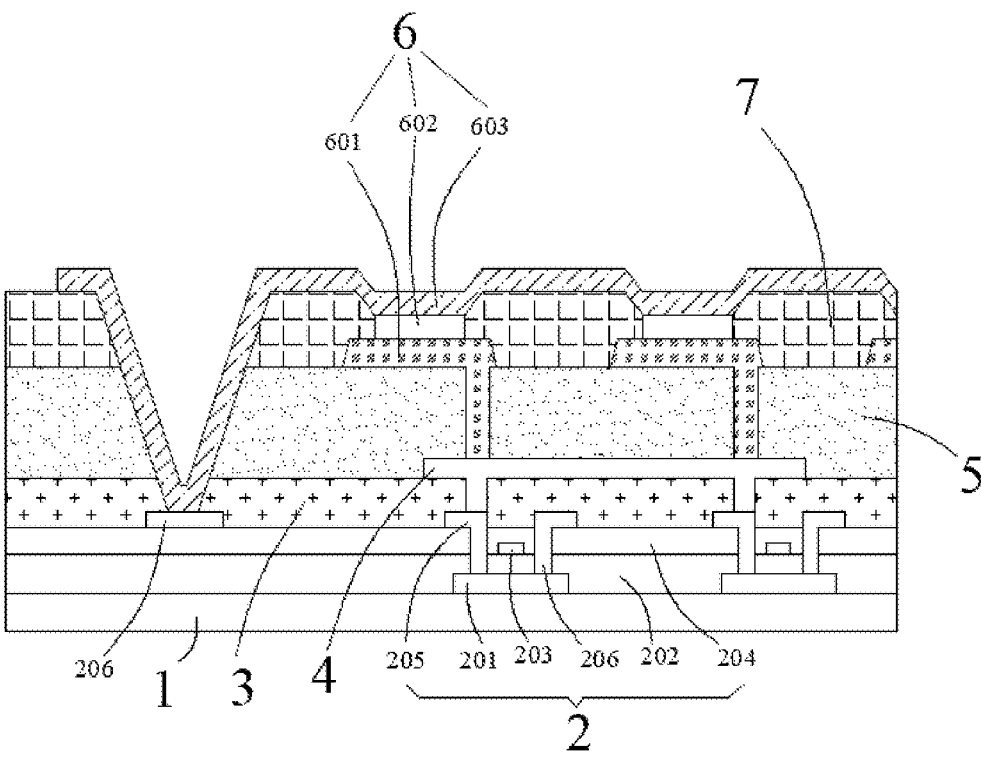
FIG. 4 is a schematic diagram of a display panel including a transistor according to an embodiment of the present disclosure.
Figure 6:
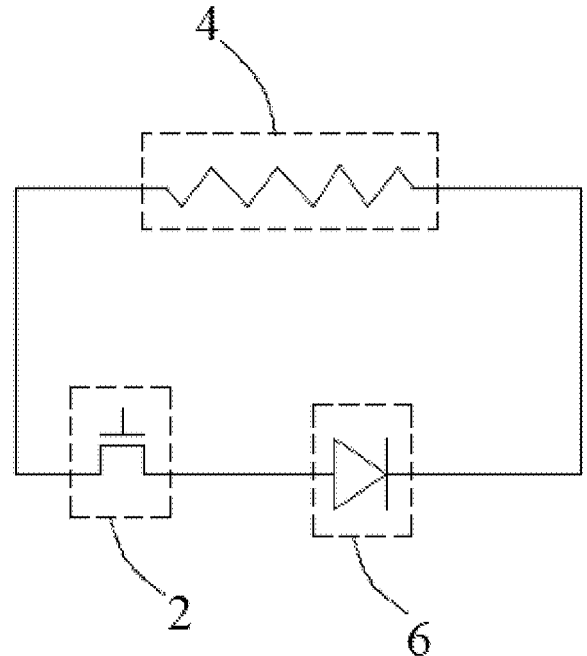
FIG. 6 is a circuit diagram of a coil, a transistor and a light emitting unit according to an embodiment of the present disclosure.

Certainly, as shown in FIGS. 4 to 6, the coil 4 may be electrically connected to only the first electrode 601. The display panel also includes a switch element disposed on the substrate 1. The coil 4 is electrically connected to the first electrode 601. The switch element is electrically connected in series between the coil 4 and the second electrode 603. The coil 4 and the light emitting unit 6 can be controlled to be turned on or off by the switch element. The switch element may be a transistor 2. The transistor 2 may have a first pole 205 which is electrically connected to the first electrode 601 by the coil 4 and have a second pole 206 which is electrically connected to the second electrode 603. Specifically, the display panel may further include a first planarization layer 5 and a second planarization layer 3. The second planarization layer 3 may be disposed on a side of the transistor 2 away from the substrate 1, the coil 4 is disposed on a side of the second planarization layer 3 away from the substrate 1, and the coil 4 passes through the second planarization layer 3 to be electrically connected to the first pole 205 of the transistor 2. The first planarization layer 5 may be disposed on a side of the coil 4 away from the substrate 1 and provided with a first window exposing the coil 4. The light emitting unit 6 is disposed on a side of the first planarization layer 5 away from the substrate 1. The first electrode 601 extends into the first window and is electrically connected to the coil 4. The second electrode 603 may be located on a side of the first electrode 601 away from the substrate 1. Of course, the first electrode 601 may be located on a side of the second electrode 603 away from the substrate 1. The display panel of the embodiments of the present disclosure may further include a pixel defining layer 7. The pixel defining layer 7 may be disposed on a side of the first planarization layer 5 away from the substrate 1 and provided with a plurality of openings. The plurality of light emitting units 6 are provided in the plurality of openings in one-to-one correspondence. For each of the light emitting units 6, for example, in a case where the second electrode 603 is located on a side of the first electrode 601 away from the substrate 1, there may be a plurality of the first windows in the above embodiments, and the first electrodes 601 of the plurality of light emitting units 6 extend into the plurality of the first windows in one-to-one correspondence so as to be electrically connected to the coil 4. There may also be a plurality of the switch elements, and the plurality of switch elements are in one-to-one correspondence with the plurality of light emitting units 6.

As shown in FIG. 4, the above transistor 2 may be a thin film transistor. The thin film transistor may include an active layer 201, a gate insulating layer 202, a gate layer 203, an interlayer insulating layer 204, a source electrode and a drain electrode. One of the source electrode and the drain electrode of the thin film transistor is the first pole 205 of the transistor 2, and the other of the source electrode and the drain electrode of the thin film transistor is the second pole 206 of the transistor 2. The active layer 201 may be disposed on the substrate 1. The gate insulating layer 202 may be disposed on the substrate 1 and cover the active layer 201. The gate layer 203 may be disposed on a side of the gate insulating layer 202 away from the substrate 1. The interlayer insulating layer 204 may be disposed on the gate insulating layer 202 and cover the gate layer 203. The first electrode 601 and the second electrode 603 may be disposed on the interlayer insulating layer 204. The above second planarization layer 3 may cover the first electrode 601 and the second electrode 603. In addition, the display panel may further include an encapsulation layer. The encapsulation layer may cover the second electrode 603. The encapsulation layer may include a first inorganic encapsulation layer, an organic encapsulation layer, and a second inorganic encapsulation layer. The first inorganic encapsulation layer is disposed opposite to the second inorganic encapsulation layer, and the organic encapsulation layer is wrapped between the first inorganic encapsulation layer and the second inorganic encapsulation layer.

As shown in FIGS. 7 and 9, the plurality of light emitting units described above may form one or more light emitting regions 23. In an embodiment of the present disclosure, each of the light emitting region 23 may be in a strip-shaped structure, and in a width direction of the light emitting region 23, an edge of the light emitting region 23 is provided with one or more protrusions 26 (see FIG. 9) with a small dimension. Based on the protrusions 26, an authenticity can be determined. For example, in a case where there are a plurality of the light emitting regions 23 and each of the light emitting regions 23 has a strip-shaped structure, as shown in FIG. 7, at least two light emitting regions 23 of the plurality of light emitting regions 23 have different widths, for example, the adjacent two light emitting regions 23 have different widths. In this way, for a display panel including a switch element, by using the switch element, one of the two light emitting regions 23 having different widths is controlled to emit light and the other light emitting region 23 does not emit light, and then the authenticity is determined based on a light emitting image of the display panel. In another embodiment of the present disclosure, at least two of the plurality of light emitting regions 23 have different shapes or light emitting colors. In this way, for the display panel including the switch element, by using the switch element, one of the two light emitting regions 23 having different shapes is controlled to emit light and the other light emitting region 23 does not emit light, and then the authenticity is determined based on the shape thereof; and by using the switch element, both of the two light emitting regions 23 having different colors are controlled to emit light, and then the authenticity is determined based on the colors. In other embodiments of the present disclosure, the light emitting region 23 can display an image having a color deviation. Specifically, as shown in FIG. 9, for example, in a case where the third light emitting unit 606 can emit green light, when the light emitting region 23 emits light, a lower edge of the light emitting region 23 will turn green. In other embodiments of the present disclosure, the coil 4 and the light emitting unit 6 are located on two sides of the substrate 1, and the coil 4 is electrically connected to the light emitting unit through a circuit board. The circuit board may be a flexible circuit board.

Figure 8:
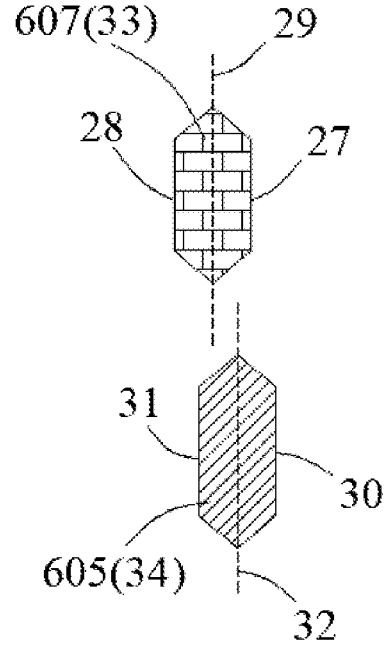
FIG. 8 is a schematic diagram of a first light emitting unit and a second light emitting unit in the structure shown in FIG. 7.

In addition, as shown in FIGS. 7 and 8, the first light emitting unit 607 has a first orthographic projection 33 on the substrate 1, and the second light emitting unit 605 has a second orthographic projection 34 on the substrate 1. The first orthographic projection 33 may be provided with a first boundary 27 and a second boundary 28 disposed opposite to each other, and a first center line 29 located between the first boundary 27 and the second boundary 28. A distance between the first boundary 27 and the first center line 29 may be the same as a distance between the second boundary 28 and the first center line 29. Further, the first orthographic projection 33 may be an axisymmetric pattern, and a symmetry axis thereof is the first center line 29. The second orthographic projection 34 may be provided with a third boundary 30 and a fourth boundary 31 disposed opposite to each other, and a second center line 32 located between the third boundary 30 and the fourth boundary 31. A distance between the third boundary 30 and the second center line 32 may be the same as a distance between the fourth boundary 31 and the second center line 32. Further, the second orthographic projection 34 may be an axisymmetric pattern, and a symmetry axis thereof is the second center line 32.

The first boundary 27, the second boundary 28, the first center line 29, the third boundary 30, the fourth boundary 31, and the second center line 32 may extend in a same direction, and in a direction perpendicular to the first center line 29, the first boundary 27 and the third boundary 30 may be located on a same side of the second center line 32, the second boundary 28 and the fourth boundary 31 may be located on a same side of the second center line 32, and the first boundary 27 may be located between the second center line 32 and the third boundary 30. Further, the first center line 29 may be located between the second centerline 32 and the fourth boundary 31. Further, the fourth boundary 31 may be located between the second boundary 28 and the first centerline 29. In a direction perpendicular to the first center line 29, the second boundary 28, the fourth boundary 31, the first center line 29, the second center line 32, the first boundary 27, and the third boundary 30 are sequentially spaced apart. For example, in a case where the plurality of light emitting units 6 form one or more light emitting region 23 and each of the light emitting region 23 has a strip-shaped structure, the above first light emitting unit 607 and the second light emitting unit 605 present in the light emitting regions 23, the above first central line 29 extends in the same direction as that of the light emitting regions 23, the first light emitting unit 607 and the second light emitting unit 605 are located in an edge region of the light emitting regions 23, and the second boundary 28, the fourth boundary 31, the first central line 29, the second central line 32, the first boundary 27, and the third boundary 30 are sequentially spaced apart, so that the edges of the light emitting regions 23 in a light emitting state show a graininess state under a microscope and the graininess state can be used for anti-counterfeiting.

Figure 11:
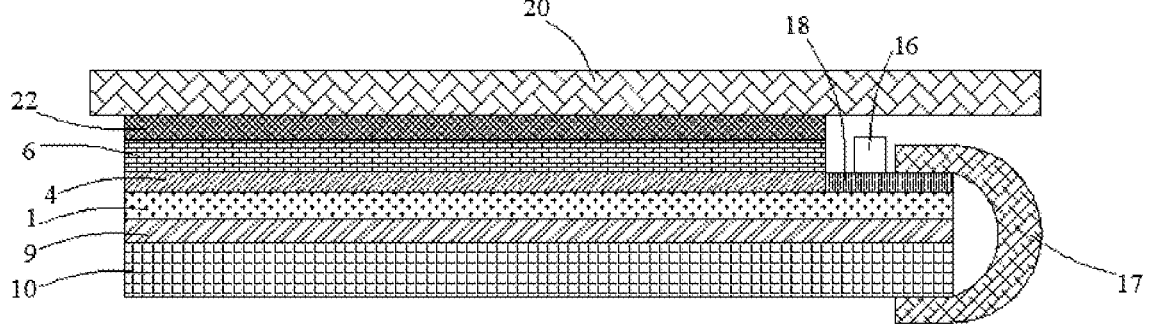
FIG. 11 is still another schematic diagram of a display panel according to an embodiment of the present disclosure.
Figure 12:
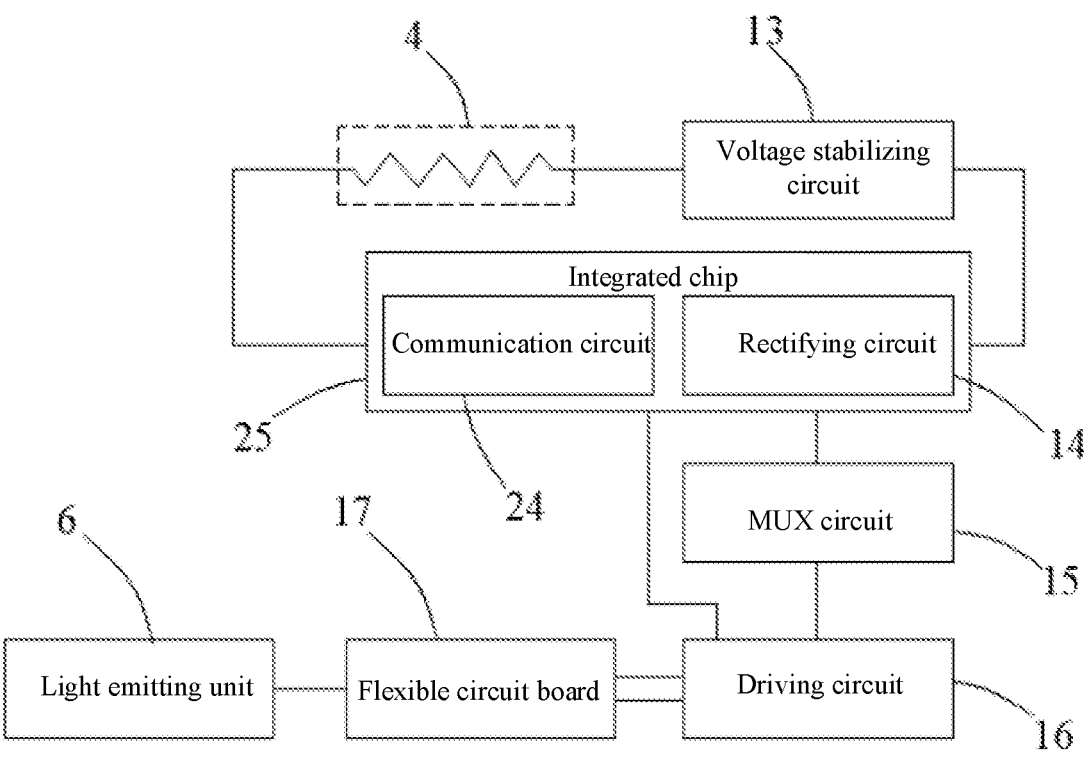
FIG. 12 is a circuit diagram of a display panel according to an embodiment of the present disclosure.

As shown in FIGS. 10 to 12, an input terminal of the voltage stabilizing circuit 13 is electrically connected to the coil 4, an output terminal of the voltage stabilizing circuit 13 is electrically connected to an input terminal of the rectifier circuit 14, an output terminal of the rectifier circuit 14 is electrically connected to an input terminal of the driving circuit 16, and an output terminal of the driving circuit 16 is electrically connected to the light emitting unit 6. Further, the coil 4 has an inductance which is set to be 10 uH or more.

As shown in FIG. 10, the coil 4 and the light emitting unit 6 may be located two side of the substrate 1. The voltage stabilizing circuit 13, the rectifying circuit 14, and the driving circuit 16 may be located on a same side of the substrate, and the driving circuit 16 is electrically connected to the light emitting unit through the flexible circuit board 17. The driving circuit 16 may be electrically connected to the light emitting unit 6 through the flexible circuit board 17. In addition, the substrate 1 is provided with a circuit wiring region 18 which is provided with an circuit interface, and the light emitting unit 6 is electrically connected to the circuit interface and the driving circuit 16 is electrically connected to the circuit interface through the flexible circuit board 17. Further, the display panel may further include a base 10. The base 10 is provided on a side of the substrate 1 away from the light emitting unit 6. For example, the base 10 is adhered to a back surface of the substrate 1 through a first adhesive layer 9. The voltage stabilizing circuit 13, the rectifying circuit 14, the driving circuit 16, and the coil 4 may be disposed on a surface of the base 10 away from the substrate 1. The base 10 may be a polymer film, a polymer rigid plate, a rigid PVC plate, a PMMA plate, or the like. The first adhesive layer 9 may be made of a material such as acrylate or the like.

In addition, as shown in FIG. 10 and FIG. 12, the display panel may further include a MUX circuit 15 and a communication circuit 24. An output terminal of the rectifier circuit 14 may be electrically connected to an input terminal of the driving circuit 16 by using the MUX circuit 15, so that a voltage input to the driving circuit 16 is within a preset voltage range. The preset voltage range may be 10V-20V, but the present disclosure is not limited thereto. An input terminal of the communication circuit 24 may be electrically connected to an output terminal of the voltage stabilizing circuit 13. When an outside electronic device provided with a transmitting coil is close to the display panel of the present embodiment, the coil 4 generates current and transmits the current to the voltage stabilizing circuit 13. The communication circuit 24 may communicate with the outside electronic device in response to an output signal of the voltage stabilizing circuit 13. The communication circuit 24 may support communication in a specific frequency range to satisfy a related wireless transmission protocol, and is compatible with an NFC encryption protocol, which can realize a query of a specific user. The specific frequency range may include 100 Khz-200 Khz. Certainly, the specific frequency range may also include a frequency value of 13.56 Mhz. The communication circuit 24 and the rectifier circuit 14 may be integrated on an integrated chip 25, which is not particularly limited in the present disclosure. In addition, an output terminal of the communication circuit 24 may also be electrically connected to an input terminal of the MUX circuit 15, and the communication circuit 24 can receive a signal sent by an external electronic device and transmit the signal to the driving circuit 16 through the MUX circuit 15. The MUX circuit 15 can process such as modulate, convert, or amplify a signal output by the communications circuit 24. The MUX circuit 15 and the communications circuit 24 may be located on a surface of the base 10 away from the substrate 1. In addition, a frequency modulation capacitor may be connected in series between the coil 4 and the voltage stabilizing circuit 13.

In other embodiments of the present disclosure, as shown in FIGS. 11 and 12, the coil 4 and the light emitting unit 6 may be located a same side of the substrate 1. The driving circuit 16 may be attached to the circuit wiring region 18, the voltage stabilizing circuit 13, the MUX circuit 15, and the integrated chip 25 including the communication circuit 24 and the rectifying circuit 14 may be disposed on the flexible circuit board 17. In addition, when the coil 4 and the light emitting units 6 may be located on the same side of the substrate 1, the display panel of the present disclosure may not be provided with the base 10.

Embodiments of the present disclosure further provide a display device. The display device may include the display panel according to any one of the above embodiments. The display device may be a smart card, a mobile phone, a tablet computer, a television, or the like. Since the display panel in the display device of the embodiment of the present disclosure is the same as the display panel in the embodiment of the display panel described above, it has the same beneficial effects, which will not be repeated here.

Figure 13:
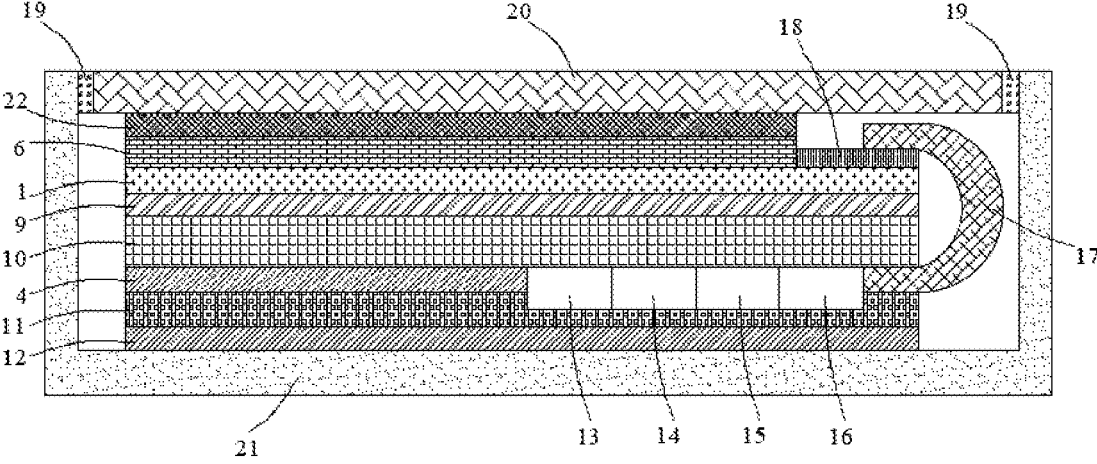
FIG. 13 is a schematic diagram of a display device according to an embodiment of the present disclosure.

As shown in FIG. 13, for example, in a case where a display device includes a display panel provided with a voltage stabilizing circuit 13, a rectifying circuit 14 and a driving circuit 16, the display device may further include a housing 21. The housing 21 may be provided with an opened end, the display panel may be disposed in the housing 21, and a light emitting side of the display panel faces the opened end. Specifically, the housing 21 includes a bottom wall and a side wall. A surface of the display panel facing the bottom wall of the housing 21 is provided with a buffer pad 11, and the buffer pad 11 is bonded to the bottom wall of the housing 21 through a second adhesive layer 12. The buffer pad 11 may be a buffer foam or a silicone pad. The display panel may further include a cover plate 20. The cover plate 20 is connected to a side of the light emitting unit 6 away from the substrate 1 through a third adhesive layer 22. The cover plate 20 is connected to the sidewall of the housing 21 through a sealant 19.

The above description is only preferred embodiments of the present disclosure, and is not intended to limit the present disclosure in any form. Although the present disclosure has been disclosed above with reference to preferred embodiments, it is not intended to limit the present disclosure. Those skilled in the art may make some changes or modifications to equivalent embodiments by using the above technical content without departing from the scope of the technical solutions of the present disclosure. Any simple modifications, equivalent changes and modifications made to the above embodiments according to the technical essence of the present disclosure still fall within the scope of the technical solution of the present disclosure.

The invention claimed is:

1. A display panel, comprising:
a substrate;
a light emitting unit disposed on the substrate and comprising a first electrode, a second electrode and a light emitting layer, wherein the first electrode is disposed opposite to the second electrode, and the light emitting layer is located between the first electrode and the second electrode;
a coil disposed on the substrate, wherein the coil is capable of generating current for the light emitting unit operating, and the coil is electrically connected to at least one of the first electrode or the second electrode;
a voltage stabilizing circuit, a rectifying circuit and a driving circuit, wherein an input terminal of the voltage stabilizing circuit is electrically connected to the coil, an output terminal of the voltage stabilizing circuit is electrically connected to an input terminal of the rectifying circuit, an output terminal of the rectifying circuit is electrically connected to an input terminal of the driving circuit, and an output terminal of the driving circuit is electrically connected to the light emitting unit; and
a switch element disposed on the substrate, wherein the coil is electrically connected to the first electrode, and the switch element is electrically connected in series between the coil and the second electrode.

2. The display panel according to claim 1, wherein the coil is electrically connected to the first electrode and the second electrode, and the display panel further comprises:
a first planarization layer covering the coil and provided with a first window and a second window exposing the coil;
wherein the light emitting unit is disposed on a side of the first planarization layer away from the substrate, the first electrode extends into the first window and is electrically connected to the coil, and the second electrode extends into the second window and is electrically connected to the coil.

3. The display panel according to claim 1, wherein the switch element comprises a transistor, a first pole of the transistor is electrically connected to the first electrode through the coil, and a second pole of the transistor is electrically connected to the second electrode.

4. The display panel according to claim 3, further comprising:
a second planarization layer disposed on a side of the transistor away from the substrate, wherein the coil is disposed on a side of the second planarization layer away from the substrate and passes through the second planarization layer to be electrically connected to the first pole of the transistor;
a first planarization layer disposed on a side of the coil away from the substrate and provided with a first window exposing the coil;

wherein the light emitting unit is disposed on a side of the first planarization layer away from the substrate, and the first electrode extends into the first window and is electrically connected to the coil.

5. The display panel according to claim 4, wherein
the second electrode is located on a side of the first electrode away from the substrate, or
the first electrode is located on a side of the second electrode away from the substrate.

6. The display panel according to claim 2, wherein there are a plurality of the light emitting units, the plurality of light emitting units share the second electrode, and the display panel further comprises:
a pixel defining layer disposed on a side of the first planarization layer away from the substrate and provided with a plurality of openings, wherein the plurality of light emitting units are disposed in the plurality of openings in a one-to-one correspondence, and the second electrode is located on a side of the first electrode away from the substrate;
wherein there are a plurality of the first windows, and the first electrodes of the plurality of light emitting units extend into the plurality of first windows in one-to-one correspondence so as to be electrically connected to the coil.

7. The display panel according to claim 1, wherein the coil comprises a plurality of coil layers stacked in a thickness direction of the substrate, and every two adjacent ones of the coil layers are connected in series.

8. The display panel according to claim 1, wherein there are a plurality of the light emitting units, and the plurality of light emitting units form an anti-counterfeiting pattern.

9. The display panel according to claim 1, wherein there are a plurality of the light emitting units, the plurality of light emitting units form a plurality of light emitting regions, each of the light emitting regions is in a strip-shaped structure, and at least two of the plurality of light emitting regions have different widths.

10. The display panel according to claim 1, wherein there are a plurality of the light emitting units, the plurality of light emitting units comprises a first light emitting unit and a second light emitting unit, the first light emitting unit has a first orthographic projection on the substrate, the second light emitting unit has a second orthographic projection on the substrate, the first orthographic projection is defined with a first boundary and a second boundary opposite to each other and has a first center line located between the first boundary and the second boundary, the second orthographic projection is defined with a third boundary and a fourth boundary opposite to each other and has a second center line located between the third boundary and the fourth boundary,
the first boundary, the second boundary, the first center line, the third boundary, the fourth boundary and the second center line extend in a same direction, the first boundary and the third boundary are located on a same side of the second center line, the second boundary and the fourth boundary are located on a same side of the second center line, and the first boundary is located between the second center line and the third boundary.

11. The display panel according to claim 10, wherein the first center line is located between the second center line and the fourth boundary.

12. The display panel according to claim 11, wherein the fourth boundary is located between the second boundary and the first center line.

13. The display panel according to claim 1, wherein there are a plurality of the light emitting units, the plurality of light emitting units form one or more light emitting regions, each of the light emitting regions has a strip-shaped structure, and one or more protrusions are provided at an edge of the light emitting region in a width direction of the light emitting region.

14. The display panel according to claim 1, wherein there are a plurality of the light emitting units, the plurality of light emitting units form one or more light emitting regions, and each of the light emitting region is capable of displaying an image having a color deviation.

15. The display panel according to claim 1, wherein the coil and the light emitting unit are located on two sides of the substrate respectively, the voltage stabilizing circuit, the rectifying circuit, the driving circuit and the coil are located on a same side of the substrate, and the driving circuit is electrically connected to the light emitting unit through a flexible circuit board.

16. The display panel according to claim 15, further comprising:

a base disposed on a side of the substrate away from the light emitting unit, wherein the voltage stabilizing circuit, the rectifying circuit, the driving circuit and the coil are disposed on a surface of the base away from the substrate; the flexible circuit board has one end electrically connected to the driving circuit and another end electrically connected to the light emitting unit.

17. The display panel according to claim 1, wherein the coil and the light emitting unit are located on two sides of the substrate respectively, and the coil is electrically connected to the light emitting unit through a flexible circuit board.

18. A display device, comprising the display panel according to claim 1.

19. The display device according to claim 18, further comprising:

a housing provided with an opened end, wherein the display panel is disposed in the housing, and a light emitting side of the display panel faces the opened end.

20. A display panel, comprising:

a substrate;

a light emitting unit disposed on the substrate and comprising a first electrode, a second electrode and a light emitting layer, wherein the first electrode is disposed opposite to the second electrode, and the light emitting layer is located between the first electrode and the second electrode;

a coil disposed on the substrate, wherein the coil is capable of generating current for the light emitting unit operating, and the coil is electrically connected to at least one of the first electrode or the second electrode; wherein the coil comprises a plurality of coil layers stacked in a thickness direction of the substrate, and every two adjacent ones of the coil layers are connected in series;

a voltage stabilizing circuit, a rectifying circuit and a driving circuit, wherein an input terminal of the voltage stabilizing circuit is electrically connected to the coil, an output terminal of the voltage stabilizing circuit is electrically connected to an input terminal of the rectifying circuit, an output terminal of the rectifying circuit is electrically connected to an input terminal of the driving circuit, and an output terminal of the driving circuit is electrically connected to the light emitting unit.

\* \* \* \* \*